(12) United States Patent
Kim

(10) Patent No.: US 7,539,922 B2
(45) Date of Patent: May 26, 2009

(54) BIT FAILURE DETECTION CIRCUITS FOR TESTING INTEGRATED CIRCUIT MEMORIES

(75) Inventor: Hyung-gon Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 691 days.

(21) Appl. No.: 11/109,529

(22) Filed: Apr. 19, 2005

(65) Prior Publication Data

US 2006/0107184 A1 May 18, 2006

(30) Foreign Application Priority Data

Nov. 4, 2004 (KR) .................. 10-2004-0089254

(51) Int. Cl.
*H03M 13/00* (2006.01)
(52) U.S. Cl. ..................................... 714/760
(58) Field of Classification Search ............. None
See application file for complete search history.

(56) References Cited

U.S. PATENT DOCUMENTS

| | | | | |
|---|---|---|---|---|
| 6,134,684 A | * | 10/2000 | Baumgartner et al. | 714/724 |
| 6,145,092 A | * | 11/2000 | Beffa et al. | 714/7 |
| 6,477,662 B1 | * | 11/2002 | Beffa et al. | 714/7 |
| 6,625,688 B1 | * | 9/2003 | Fruehling et al. | 711/109 |
| 2002/0133763 A1 | * | 9/2002 | Fleischer-Reumann et al. | 714/704 |
| 2002/0184557 A1 | * | 12/2002 | Hughes et al. | 714/8 |
| 2003/0005389 A1 | * | 1/2003 | Ernst et al. | 714/798 |
| 2005/0022060 A1 | * | 1/2005 | Hashimoto et al. | 714/37 |
| 2005/0281112 A1 | * | 12/2005 | Ito et al. | 365/222 |
| 2006/0156192 A1 | * | 7/2006 | Nakamura et al. | 714/763 |
| 2006/0200719 A1 | * | 9/2006 | Keller | 714/732 |

FOREIGN PATENT DOCUMENTS

| | | |
|---|---|---|
| JP | 00132095 A | 5/1992 |
| JP | 00063300 A | 3/1997 |
| JP | 00077294 A | 3/2003 |
| KR | 100253707 B1 | 1/2000 |

* cited by examiner

*Primary Examiner*—Jacques Louis-Jacques
*Assistant Examiner*—Guerrier Merant
(74) *Attorney, Agent, or Firm*—Myers Bigel Sibley & Sajovec

(57) ABSTRACT

A bit failure detection circuit supports reliability testing of a memory device by accumulating a sum of data errors in data read from the memory device. The detection circuit compares a plurality of bytes of data read from the memory device against a plurality of bytes of reference data supplied during a test operation. The detection circuit also generates a flag upon detection that the sum of data errors exceeds a threshold number of acceptable data errors.

10 Claims, 4 Drawing Sheets

BIT FAILURE DETECTION CIRCUITS FOR TESTING INTEGRATED CIRCUIT MEMORIES

REFERENCE TO PRIORITY APPLICATION

This application claims priority to Korean Application Serial No. 2004-89254, filed Nov. 4, 2004, the disclosure of which is hereby incorporated herein by reference.

FIELD OF THE INVENTION

The present invention relates to integrated circuit devices and methods of testing integrated circuit devices and, more particularly, to integrated circuit memory devices and methods of testing reliability of integrated circuit memory devices.

BACKGROUND OF THE INVENTION

Non-volatile memory devices include a class of electrically erasable and programmable memory devices that are frequently used in data storage systems. Such data storage systems may utilize error detection and correction (EDC) circuitry to detect and correct a limited number of data errors that occur when programming and reading the non-volatile memory devices, which may have one or more defective memory cells therein. In some applications that do not require very high levels of data integrity, it may not be necessary for the EDC circuitry to correct all detected errors. Nonetheless, it may be necessary that the number of uncorrected errors in the storage system be monitored to insure that the number is not too large for the intended application. One conventional device for detecting bit failures may be utilized in a system containing non-volatile memory devices with single-level memory cells (SLC) and EDC circuitry that can correct one-bit failures. This device is described in Korean Patent Publication No. 2002-43378.

The manufacturing yield of non-volatile memory devices having multiple memory array blocks therein may be increased if efficient testing techniques are utilized to identify and disable defective memory array blocks within the memory device. However, as more advanced non-volatile memory devices are developed using multi-level memory cells (MLC), EDC circuitry will also need to be developed to detect and correct a greater number of errors.

SUMMARY OF THE INVENTION

Integrated circuit devices according to embodiments of the invention include a bit failure detection circuit. This bit failure detection circuit is configured to accumulate a sum of data errors detected by comparing a plurality of bytes of data read from a memory device against a plurality of bytes of reference data supplied during a test operation. The bit failure detection circuit is further configured to generate a flag upon detection that the sum of data errors exceeds a threshold number of acceptable data errors. The generation of the flag can also be programmed to occur when then number of detected errors is below the threshold number. In particular, the bit failure detection circuit may also be configured to generate the flag upon detection that a sum of a positive reference bit value and the sum of data errors exceeds the threshold number of acceptable data errors.

In these embodiments, the bit failure detection circuit may include a full adder. This full adder generates a first carry signal in response to an addition operation. This first carry signal indicates whether the sum of data errors exceeds the threshold number of acceptable data errors. The bit failure detection circuit may also include a reference bit adder. This reference bit adder generates a second carry. This second carry signal indicates whether the sum of the positive reference bit value and the sum of the data errors exceeds the threshold number of acceptable data errors.

The bit failure detection circuit may also include a data comparison circuit. This circuit is configured to receive the plurality of bytes of data read from the memory device and the plurality of bytes of reference data supplied during a test operation. This data comparison circuit may include an array of XOR elements that receives the plurality of bytes of data read from the memory device and the plurality of bytes of reference data supplied during a test operation. A bit process addition circuit may also be provided. This circuit is configured to convert a string of M-bits at an output of the data comparison circuit into a $\log_2 M$-bit binary value. The full adder is also configured to receive a plurality of $\log_2 M$-bit binary values generated by the bit process addition circuit during the test operation.

Still further embodiments of the invention include methods of detecting bit failures in non-volatile memory data by programming a non-volatile memory device with a first plurality of bytes of data (e.g., page of data) and then reading back the first plurality of bytes of data from the non-volatile memory device during an error test operation. A step is then performed to compare each of the first plurality of bytes of data read from the non-volatile memory device against a corresponding plurality of bytes of reference data to identify one or more errors in the first plurality of bytes of data read from the non-volatile memory device. The first plurality of bytes of data and the reference data may be provided by a testing apparatus. In response to the comparing step, a sum of identified errors in the first plurality of bytes of data is accumulated and a flag is generated in response to detecting that the accumulated sum of identified errors exceeds a threshold. In some of these embodiments, this accumulating step may include adding a reference bit value to the accumulated sum of identified errors, to adjust when the flag is to be generated (e.g., lower the number of errors that must be identified to trigger generation of the flag).

DESCRIPTION OF PREFERRED EMBODIMENTS

Figure 1:
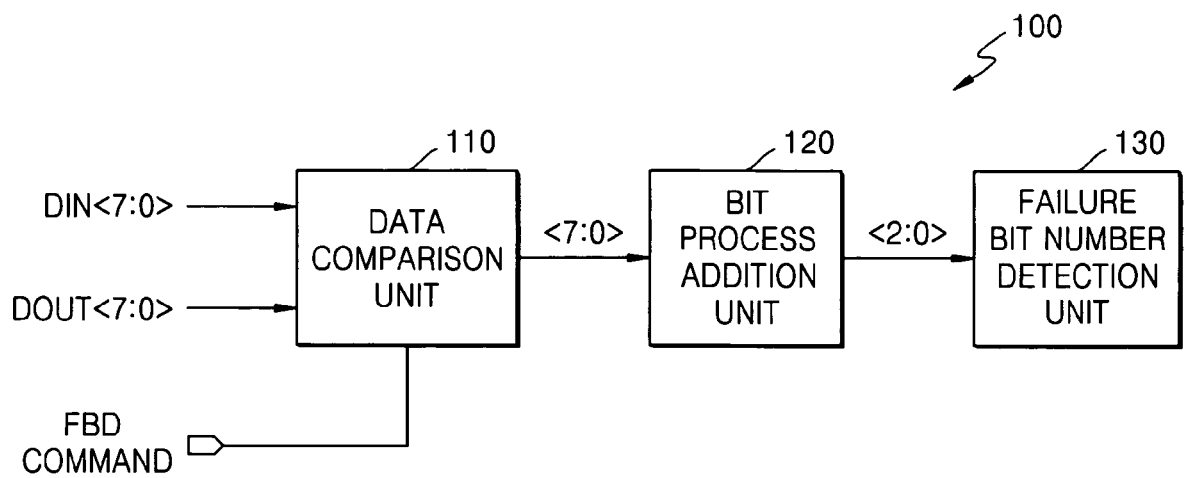
FIG. 1 is a block diagram of a bit failure detection circuit according to embodiments of the present invention.

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters.

FIG. 1 illustrates a bit failure detection circuit 100 according to embodiments of the invention. This bit failure detection circuit 100 is illustrated as including a data comparison circuit 110, which is responsive to a failure bit detection (FBD) command, a bit process addition circuit 120 and a failure bit number detection circuit 130, connected in series as illustrated. The data comparison circuit 110 is configured to receive a plurality of bytes of data read from a memory device (not shown) at one input port thereof. Each of these bytes of data is illustrated as an 8-bit byte DOUT<7:0>, however, other data widths are also possible in alternative embodiments. These 8-bit bytes DOUT<7:0> may be read from a plurality of addresses in a page block of the memory device. In some embodiments of the invention, the memory device may be nonvolatile memory device (e.g., NAND EEPROM). The data comparison circuit 110 is also configured to receive a plurality of bytes of reference data at another input port thereof. This reference data may be provided from a testing apparatus (not shown) to input pins of an integrated circuit device containing the bit failure detection circuit 100. Each of the plurality of bytes of reference data is illustrated as an 8-bit byte DIN<7:0>. This reference data also represents data that was previously programmed (e.g., written) into the memory device in preparation for the error test operations described herein. This programmed data may contain one or more errors when read out of a memory device containing memory cell defects.

The data comparison circuit 110 is configured to perform a bit-by-bit comparison between each byte of the reference data and corresponding byte of the data read from the memory device under test. This bit-by-bit *comparison results in a generation of an 8-bit output vector <7:0> for each byte-by-byte comparison operation. In particular, the data comparison circuit 110, which may contain an array of XOR logic elements, may generate a sequence of 8-bit strings of "1"s and "0"s which identify inconsistencies between the data and reference bytes being compared. For example, if an 8-bit byte DIN<7:0> supplied to the integrated circuit equals <10110001> and a corresponding 8-bit byte DOUT<7:0> read from memory equals <10000000>, then the data comparison circuit 110 may generate an output vector <7:0> as <00110001> to reflect the presence of three inconsistencies (i.e., errors) between the corresponding bytes. In this case, each "1" within the output vector <7:0> represents a bit inconsistency and each "0" represents a bit equivalency.

The output vector <7:0> is supplied as an input to the bit process addition circuit 120, which performs a summing operation on the output vector <7:0> and generates a 3-bit error sum <2:0>. Alternative embodiments may utilize error sums having a greater or fewer number of bits. In particular, the bit process addition circuit 120 may generate a bit error sum <2:0> that specifies a number of "1"s in each corresponding output vector <7:0>. For example, if the output vector <7:0> equals <00110001>, then the bit error sum <2:0> will equal 011b (where "b" designates binary format). This sum value specifies that three bit errors are present in the corresponding 8-bit byte DOUT<7:0> previously read from memory. Similarly, if the output vector <7:0> equals <11110001>, then the bit error sum <2:0> will equal 101b, which specifies that five bit errors are present.

Figure 2:
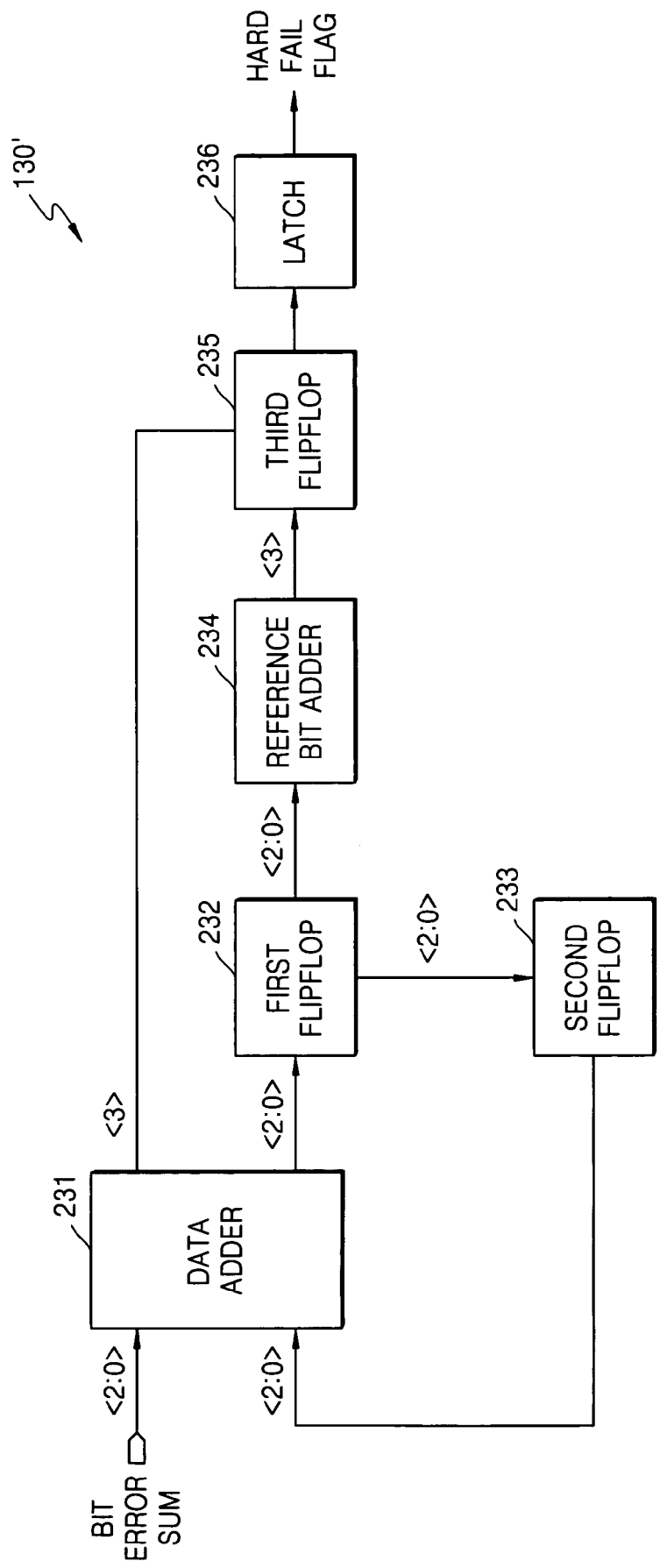
FIG. 2 is a block diagram of a failure bit number detection circuit according to embodiments of the invention, which may be used in the bit failure detection circuit of FIG. 1.

The bit error sum <2:0> is provided as an input to the failure bit number detection circuit 130. An exemplary failure bit number detection circuit 130' includes a data adder 231, a first flip-flop 232, a second flip-flop 233, a reference bit adder 234, a third flip-flop 235 and an output latch 236, connected as illustrated in FIG. 2. These elements of the failure bit number detection circuit 130' may be synchronized with a clock signal(s) or other synchronizing signal (not shown). The data adder 231, first flip-flop 232 and second flip-flop 233 collectively perform a bit error accumulation operation. This accumulation operation is performed to accumulate a sum of errors associated with the plurality of 8-bit bytes<7:0> read in sequence from the memory device. This plurality of bytes may correspond to all bytes within a page block of the memory device, however, other configurations are also possible.

In particular, each bit error sum <2:0> received from the bit process addition circuit 120 is added by the data adder 231 to a previously accumulated sum, which is reflected at an output of the second flip-flop 233. Thus, if the output <2:0> of the second flip-flop equals 001b and the current bit error sum <2:0> received by the data adder 231 equals 010b, then the updated output <2:0> of the data adder 231 will equal 011b. The output <3> of the data adder 231 reflects a "carry" output of a full adder circuit. Thus, if the output <2:0> of the second flip-flop equals 011b (i.e., 3 errors) and the current bit error sum <2:0> received by the data adder 231 equals 101b (i.e., five errors), then the carry output <3> of the data adder 231 will equal 1b and the updated output <2:0> of the data adder 231 will equal 000b. In this case, the combined outputs of the data adder 231 reflect the value 1000b, which is 8 in decimal format.

An asserted carry output <3> of the data adder 231 (i.e., <3>=1b) is provided directly to the third flip-flop 235 to indicate that an excessive number of bit errors has been recorded by the data adder 231. In the illustrated embodiment, this excessive number of bit errors equals 8 or more accumulated bit errors. The third flip-flop 235 passes this recorded carry output <3> to an output latch 236. In response, the output latch 236 generates a flag to signify a hard failure (i.e., the detection of an excessive number of bit errors in the data being read from the memory device to the data comparison circuit 110).

The output <2:0> of the data adder 231 may also be used to indicate an excessive number of bit errors for the case where the excessive number is programmed to be less than 8 (i.e., 1000b) for a given application. As illustrated, the output <2:0> of the data adder 231, which reflects the three least significant bits of the total four bit sum computed by the data adder 231 in response to an incoming bit error sum <2:0> generated by the bit process addition circuit 120, is provided to the first flip-flop 232. The first flip-flop 232 passes each received 3-bit sum to the second flip-flop 233 and to the reference bit adder 234. This reference bit adder 234 operates to add the incoming 3-bit sum <2:0> to an internal reference bit value and pass any generated carry result <3> to another input of the third flip-flop 235, which may be logically OR'ed with the input connected to the carry output <3> of the data adder 231. This internal reference bit value may be a hard set value, such as a value set by a fuse element(s), or a programmable value retained by a register (not shown). The use of a reference bit value having a value greater than 0b supports the generation of the hard failure flag for those cases where less than 8 bit errors are considered excessive. For example, if the reference bit value is set to 011b, then the accumulation of five (101b) or more errors by the data adder 231 will result in the generation of a hard failure flag by the latch 236. This result can be understood by recognizing that a sum of 011b (the reference bit value) and 101b (generated at the output of the first flip-flop 232) equals 1000b. This means the output <3> of the reference bit adder 234 will equal "1" to reflect the detection of an excessive number of errors even for those cases where the carry result <3> generated by the data adder does not reflect the presence of at least 8 errors. In some applications, the value of the reference bit value will be set to a positive number that will result in the generation of a hard failure flag whenever a larger number of errors are present than can be corrected using error detection and correction (EDC) circuitry within the integrated circuit device.

Figure 3:
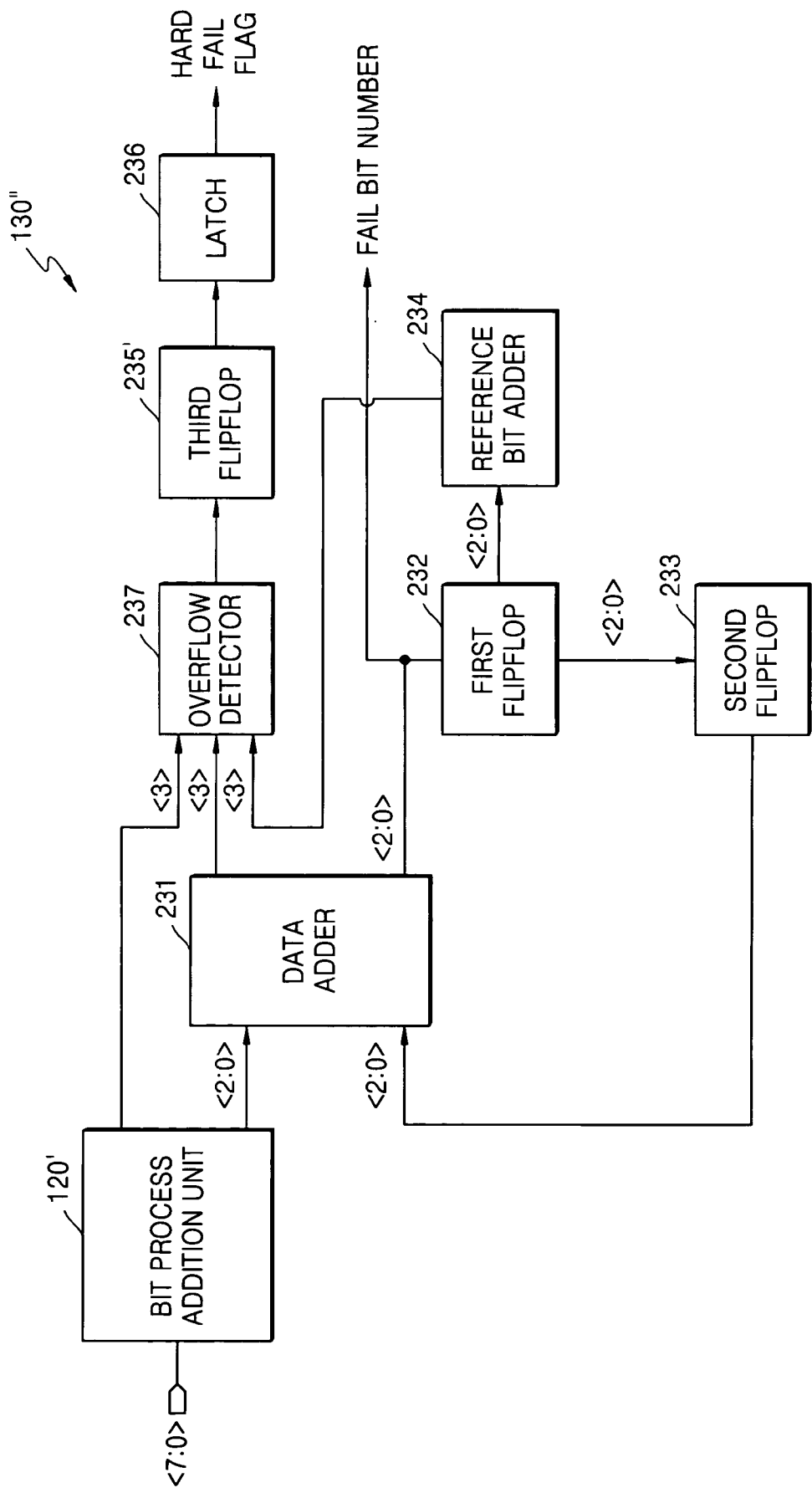
FIG. 3 is a block diagram of a bit process addition circuit and failure bit number detection circuit according to embodiments of the invention, which may be used in the bit failure detection circuit of FIG. 1.

Another failure bit number detection circuit 130" includes a data adder 231, a first flip-flop 232, a second flip-flop 233, a reference bit adder 234, an overflow detector 237, a third flip-flop 235' and an output latch 236, connected as illustrated in FIG. 3. These elements of the failure bit number detection circuit 130" may be synchronized with a clock signal(s) or other synchronizing signal (not shown). This failure bit number detection circuit 130" is similar to the failure bit number detection circuit 130' of FIG. 2, however, two modifications are present. The first modification relates to the inclusion of the overflow detector 237, which may be configured as a 3-input OR gate having an output coupled to a data input of the third flip-flop 235'. This overflow detector 237 is configured to receive a carry output <3> from a bit process addition circuit 120', a carry output <3> from the data adder 231 and an output <3> from the reference bit adder 234.

The inclusion of the overflow detector 237 avoids a potential limitation associated with the failure bit number detection circuit 130' of FIG. 2. In particular, the overflow detector 237 enables the recording of 8-bit errors that may be detected by the bit process addition circuit 120', which is shown as including a carry output <3>. In particular, if the 8-bit output of the data comparison circuit 110 of FIG. 1 generates an output vector <7:0> equivalent to <11111111> to reflect the presence of eight errors within a single 8-bit byte DOUT<7:0>, then the 3-bit output <2:0> of the bit process addition circuit 120' in FIG. 3 will reflect the value 000b, which erroneously identifies no data errors in the corresponding 8-bit byte DOUT<7:0>. However, the output <3>=1b of the bit process addition circuit 120' will correctly identify the presence of eight errors and this indication will be passed via the overflow detector 237 to the third flip-flop 235' and latch 236 and communicated as an active hard failure flag. The failure bit number detection circuit 130" also generates a fail bit number directly from an output <2:0> of the data adder 231. This fail bit number may correctly identify a number of errors for those cases where the number of errors has not exceeded seven errors (i.e., the carry output <3> of the data adder 231 is not 1b).

Figure 4:
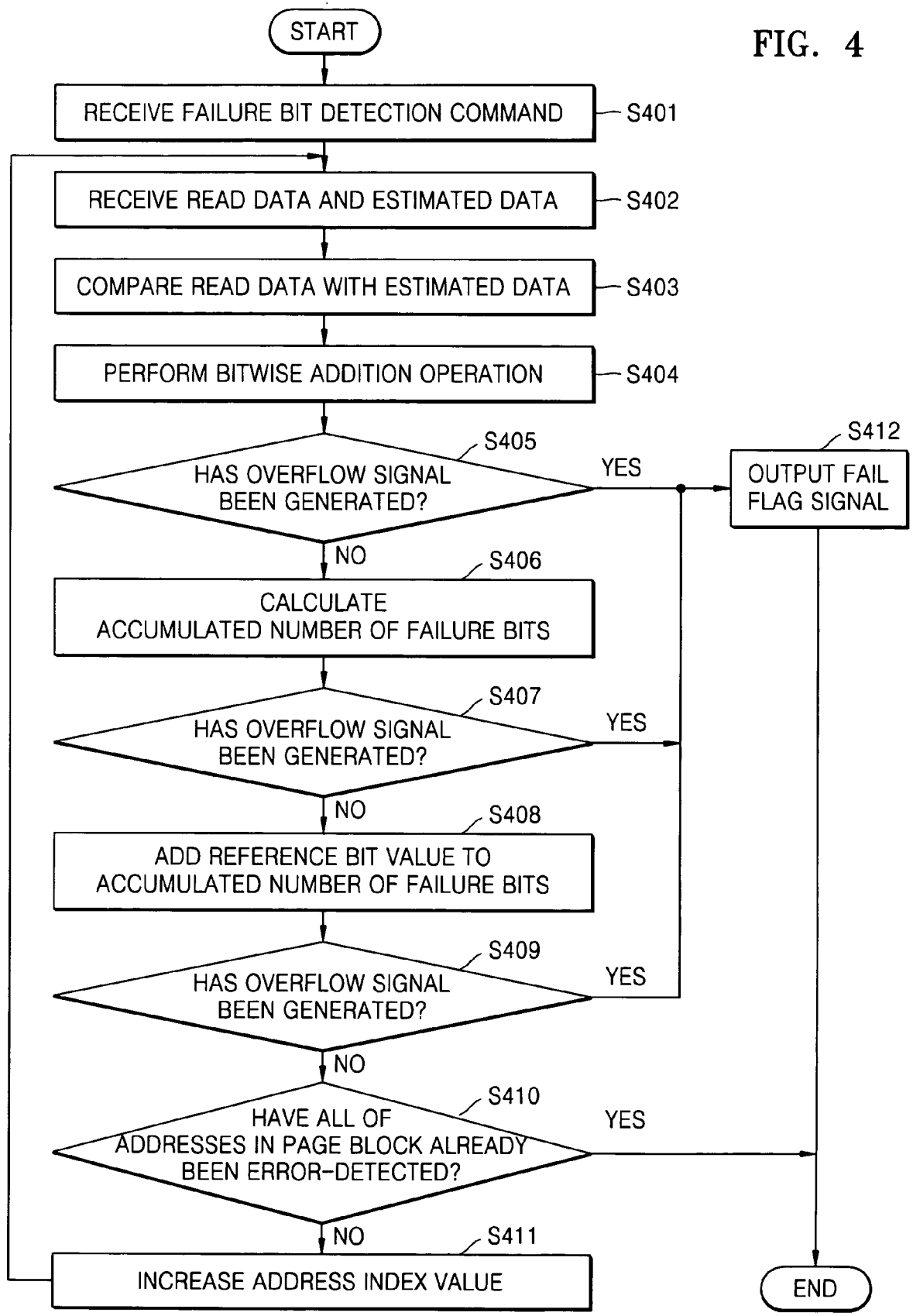
FIG. 4 is a flow diagram of operations performed by the bit failure detection circuit of FIGS. 1 and 3.

The operation of the bit failure detection circuit 100 of FIGS. 1 and 3 will now be described more fully with reference to the flow-diagram of FIG. 4. As illustrated by Block S401, the operations of the failure bit detection circuit 100 may commence upon receipt of a failure bit detection (FBD) command. This command may be issued by a testing apparatus during operations to test a memory device (e.g., non-volatile memory device) for the presence of any memory defects and determine whether a number of defects exceeds a threshold number of defects that may be corrected using built-in EDC circuitry or acceptable for a given application. At Block S402, the data DOUT<7:0> read from memory and the "equivalent" reference data DIN<7:0> are received by the data comparison circuit 110. A comparison operation is then performed by the data comparison circuit 110, Block S403. This comparison operation may result in the generation of a string of bits that reflect the presence or absence of bit errors. As illustrated by Block S404, a bitwise addition operation is performed by the bit process addition circuit 120'. At Block S405, a check is made to determine whether the carry output <3> of the bit process addition circuit 120' reflects eight or more errors. If so, an output of the overflow detector 237 will reflect the presence of an excessive number of errors and this output will be passed to the latch 236 so that a hard failure flag can be generated, Block S412. A calculation is also performed by the data adder 231, S406. If this calculation causes the data adder 231 to generate a carry output <3>=1b, then another overflow signal will be generated by the overflow detector 237 and trigger the generation of a hard failure flag, Blocks S407 and S412.

Thereafter, at Block S408, an operation is performed by the reference bit adder 234 to add a reference bit value (programmable value or hard set value) to the output <2:0> of the first flip-flop 232 and then generate a "carry" signal <3> at a "0" or "1" value. This addition operation may result in the generation of an overflow signal by the overflow detector 237 and the generation of a hard failure flag, Blocks S409 and S412. Finally, a check is made to determine whether all necessary bytes of data DOUT<7:0> have undergone the error detection operations described herein. In particular, this check may include confirming whether or not all bytes of data from all addresses within a selected page block of memory have been checked, Block S410. If not, a next address in the page block of memory may be identified, Block S411, prior to return to the operations of Block S402.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit device, comprising:
   a bit failure detection circuit configured to accumulate a sum of data errors detected by comparing a plurality of bytes of data read from a memory device against a plurality of bytes of reference data supplied during a test operation and further configured to generate a flag upon detection that the sum of data errors exceeds a threshold number of acceptable data errors, said bit failure detection circuit comprising:
   a full adder configured to generate a first carry signal that indicates whether the sum of data errors exceeds the threshold number of acceptable data errors; and
   a reference bit adder configured to generate a second carry signal that indicates whether the sum of the positive reference bit value and the sum of the data errors exceeds the threshold number of acceptable data errors.

2. The device of claim 1, wherein said bit failure detection circuit is further configured to generate the flag upon detection that a sum of a positive reference bit value and the sum of data errors exceeds the threshold number of acceptable data errors.

3. The device of claim 1, wherein said bit failure detection circuit comprises a data comparison circuit configured to receive the plurality of bytes of data read from the memory device and the plurality of bytes of reference data supplied during a test operation.

4. The device of claim 1, further comprising a overflow detector configured to generate a carry signal from a logically OR-ing of the first and second carry signals.

5. An integrated circuit device, comprising:
   a bit failure detection circuit configured to accumulate a sum of data errors detected by comparing a plurality of bytes of data read from a memory device against a plurality of bytes of reference data supplied during a test operation and further configured to generate a flag upon detection that the sum of data errors exceeds a threshold number of acceptable data errors, said bit failure detection circuit comprising a data comparison circuit configured to receive the plurality of bytes of data read from the memory device and the plurality of bytes of reference data supplied during a test operation, said data comparison circuit comprising an array of XOR elements that receives the plurality of bytes of data read from the memory device and the plurality of bytes of reference data supplied during a test operation: and a bit process addition circuit configured to convert a string of M-bits at an output of said data comparison circuit into a $\log_2 M$-bit binary value.

6. The device of claim 5, wherein said bit failure detection circuit comprises a full adder configured to receive a plurality of $\log_2 M$-bit binary values generated by said bit process addition circuit during the test operation.

7. A method of operating an integrated circuit device, comprising the steps of:

programming a non-volatile memory device with a first plurality of bytes of data;

reading the first plurality of bytes of data from the non-volatile memory device;

comparing each of the first plurality of bytes of data read from the non-volatile memory device against a corresponding plurality of bytes of reference data to identify one or more errors in the first plurality of bytes of data read from the non-volatile memory device;

accumulating a sum of identified errors in the first plurality of bytes of data; and generating a flag in response to detecting that the accumulated sum of identified errors exceeds a threshold;

wherein said accumulating step comprises adding a reference bit value to the accumulated sum of identified errors.

8. An integrated circuit device, comprising:

a bit failure detection circuit configured to accumulate a sum of data errors detected by comparing a plurality of bytes of data read from a memory device against a plurality of bytes of reference data supplied during a test operation and further configured to generate a flag upon detection that a sum of a positive reference bit value and the sum of data errors exceeds a threshold number of acceptable data errors;

wherein the positive reference bit value is variably set depending on a maximum number of failure bits that can be left uncorrected.

9. The device of claim 8, wherein said bit failure detection circuit comprises a full adder configured to generate a first carry signal that indicates whether the sum of data errors exceeds the threshold number of acceptable data errors.

10. The device of claim 9, wherein said bit failure detection circuit comprises a reference bit adder configured to generate a second carry signal that indicates whether the sum of the positive reference bit value and the sum of the data errors exceeds the threshold number of acceptable data errors.

* * * * *